United States Patent
Hamann et al.

(10) Patent No.: US 9,258,932 B2
(45) Date of Patent: Feb. 9, 2016

(54) DATA CENTER THERMAL MANAGEMENT

(75) Inventors: Hendrik F. Hamann, Yorktown Heights, NY (US); Hongfei Li, Briarcliff Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 895 days.

(21) Appl. No.: 13/336,266

(22) Filed: Dec. 23, 2011

(65) Prior Publication Data

US 2013/0166241 A1   Jun. 27, 2013

(51) Int. Cl.
| | |
|---|---|
| G06F 19/00 | (2011.01) |
| H05K 7/20 | (2006.01) |
| G06Q 10/06 | (2012.01) |
| G01K 7/42 | (2006.01) |
| G06F 1/20 | (2006.01) |

(52) U.S. Cl.
CPC .............. *H05K 7/20836* (2013.01); *G01K 7/42* (2013.01); *G06F 1/206* (2013.01); *G06Q 10/06* (2013.01); *Y02B 60/1275* (2013.01)

(58) Field of Classification Search
CPC ...... G06F 1/206; H05K 7/20836; G01K 7/42; G01K 2215/00; G01K 7/425
USPC .............. 374/137; 702/130, 136, 99, 2; 703/6
See application file for complete search history.

(56) References Cited

U.S. PATENT DOCUMENTS

| | | | | |
|---|---|---|---|---|
| 6,345,113 | B1* | 2/2002 | Crawford et al. | 382/131 |
| 7,676,280 | B1* | 3/2010 | Bash et al. | 700/17 |
| 2007/0038414 | A1* | 2/2007 | Rasmussen et al. | 703/1 |
| 2009/0276095 | A1* | 11/2009 | Pienta et al. | 700/277 |
| 2009/0326884 | A1* | 12/2009 | Amemiya et al. | 703/6 |
| 2011/0040532 | A1* | 2/2011 | Hamann et al. | 703/2 |

FOREIGN PATENT DOCUMENTS

WO    2010126469 A1    11/2010

OTHER PUBLICATIONS

Noel A. C. Cressie "Statistics for Spatial Data", Wiley series in probability and mathematical statistics. Applied probability and statistics section, Revised Edition. New York, NY: Wiley 1993, pp. 58-62, 120-125.
Combined Search and Examination Report mailed May 30, 2013 in related GB Patent Application No. GB1222537.1.
Response to GB Combined Search and Examination Report filed on Oct. 8, 2013 in GB Patent Application No. GB1222537.1.
United Kingdom Search Report dated Mar. 13, 2014 issued in counterpart application No. GB 1222537.1.
Response to United Kingdom Search Report dated May 6, 2014.

* cited by examiner

*Primary Examiner* — Sujoy Kundu
*Assistant Examiner* — Lisa Peters
(74) *Attorney, Agent, or Firm* — Scully, Scott, Murphy & Presser, P.C.; Daniel P. Morris, Esq.

(57) ABSTRACT

Historical high-spatial-resolution temperature data and dynamic temperature sensor measurement data may be used to predict temperature. A first formulation may be derived based on the historical high-spatial-resolution temperature data for determining a temperature at any point in 3-dimensional space. The dynamic temperature sensor measurement data may be calibrated based on the historical high-spatial-resolution temperature data at a corresponding historical time. Sensor temperature data at a plurality of sensor locations may be predicted for a future time based on the calibrated dynamic temperature sensor measurement data. A three-dimensional temperature spatial distribution associated with the future time may be generated based on the forecasted sensor temperature data and the first formulation. The three-dimensional temperature spatial distribution associated with the future time may be projected to a two-dimensional temperature distribution, and temperature in the future time for a selected space location may be forecasted dynamically based on said two-dimensional temperature distribution.

18 Claims, 6 Drawing Sheets

DATA CENTER THERMAL MANAGEMENT

STATEMENT REGARDING FEDERALLY SPONSORED RESEARCH OR DEVELOPMENT

This invention was made with Government support under Contract No.: DE-EE00002897 awarded by Department of Energy. The Government has certain rights in this invention.

FIELD

The present application relates generally to computer applications, analytics and optimization, and more particularly to thermal management for facilities such as data centers.

BACKGROUND

The inventors in the present application have recognized that forecasting temperature distributions in three dimensions in future time can provide data that help in managing energy efficiently, for example, in buildings and/or facilities such as data centers. For example, such forecasted data can help in identifying hot spots to prevent machine failures, identifying overcooling to avoid unnecessary energy waste, and understanding the impacts of cooling conditions and data center layout on temperature distribution.

However, current work on temperature estimation has been focusing on using computational fluid dynamics (CFD) physical models, which involves differential and partial differential equations. CFD models can take relatively long time to estimate temperature, especially when it involves spatial dimensions, e.g., three dimensions.

BRIEF SUMMARY

A method of data center thermal management, in one aspect, may include receiving historical high-spatial-resolution temperature data and deriving a first formulation based on the historical high-spatial-resolution temperature data for determining a temperature at any point in 3-dimensional space as a function of physical observables. The method may also include receiving dynamic temperature sensor measurement data in real-time measured by a plurality of sensors at respective plurality of sensor locations, and calibrating the dynamic temperature sensor measurement data based on a calibration model using historical high-spatial-resolution temperature data and sensor temperature observations at a corresponding historical time and corresponding location. The method may further include forecasting sensor temperature data at said plurality of sensor locations for a future time based on the calibrated dynamic temperature sensor measurement data, and generating a three-dimensional temperature spatial distribution associated with the future time based on the forecasted sensor temperature data and the first formulation. The method may also include projecting the three-dimensional temperature spatial distribution associated with the future time to a two-dimensional temperature distribution, and forecasting temperature in the future time for a selected space location dynamically based on said two-dimensional temperature distribution.

A system for data center thermal management, in one aspect, may include a knowledge-base including a first formulation built based on historical high-spatial-resolution temperature data, the first formulation for determining a temperature at any point in 3-dimensional space as a function of physical observables. A calibration module is operable to calibrate dynamic temperature sensor measurement data measured by a plurality of sensors at respective plurality of sensor locations, the calibrating performed based on a calibration model using historical high-spatial-resolution temperature data and sensor temperature observations at a corresponding historical time and corresponding location. A first forecast module may be operable to forecast sensor temperature data at said plurality of sensor locations for a future time based on the calibrated dynamic temperature sensor measurement data. A second forecast module may be operable to generate a three-dimensional temperature spatial distribution associated with the future time based on the forecasted sensor temperature data and the first formulation, the second forecast module further operable to project the three-dimensional temperature spatial distribution associated with the future time to a two-dimensional temperature distribution, the second forecast module further operable to forecast temperature in the future time for a selected space location dynamically based on said two-dimensional temperature distribution.

A computer readable storage medium storing a program of instructions executable by a machine to perform one or more methods described herein also may be provided.

Further features as well as the structure and operation of various embodiments are described in detail below with reference to the accompanying drawings. In the drawings, like reference numbers indicate identical or functionally similar elements.

DETAILED DESCRIPTION

The present disclosure describes a system and method of temperature forecasting in time and in space, for instance, to manage thermal conditions of data centers, which may utilize multiple data sources. A statistical method in one embodiment may have computational benefits and forecast temperature at future time and in high resolution space which takes less time, for example, in the magnitude of minutes.

Figure 1:
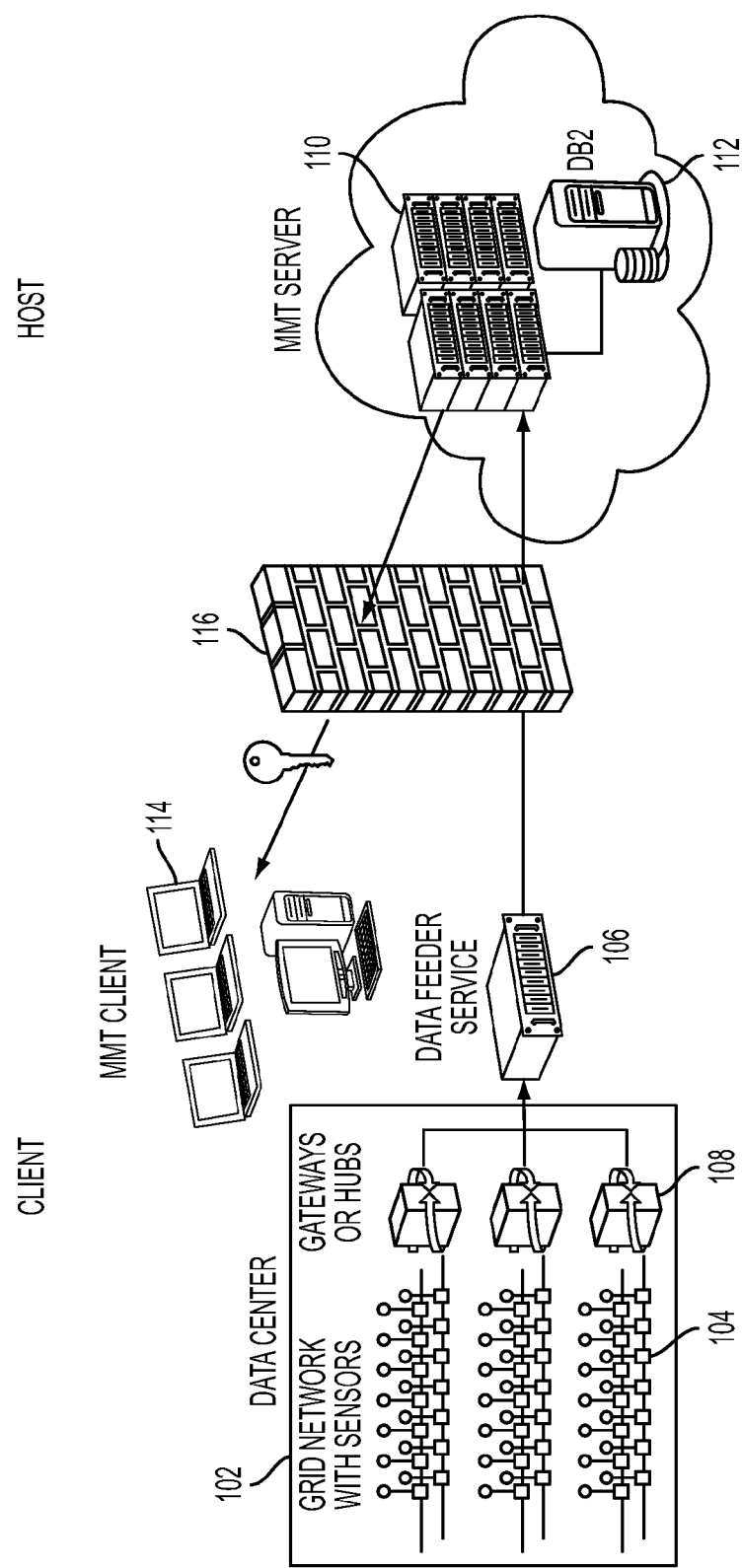
FIG. 1 is an architectural diagram illustrating system components for temperature forecasting in one embodiment of the present disclosure.

FIG. 1 is an architectural diagram illustrating system components for temperature forecasting in one embodiment of the present disclosure. A data center 102, or the like (e.g., telecommunication facility or other), may include a network of sensor 104 installed in a plurality of locations. For instance, sensors may be located sparsely throughout the data center 102. Each of the sensors 104 determines the temperature of the immediate area where that sensor is located, and transmits the temperature data to a data feeder service 106, for instance, via gateways or hub computing components 108 to an MMT (measurement and management technologies) server 110. The MMT server 110 and associated database 112, for instance, may reside behind a firewall 116, and are connected remotely to the data center 102, and receive the dynamic temperature data detected by the sensors 104. The MMT server 110 also includes one-time measurements of 3-D high-spatial-resolution temperature of the data center monitored periodically, e.g., data collected from high resolution scans of temperature in the data center 102 or knowledge base information. MMT clients 114 may be a client application that enables operators to manage cooling (or controlling temperature) in the data centers by showing 3-D temperature distribution information in the data centers.

Figure 2:
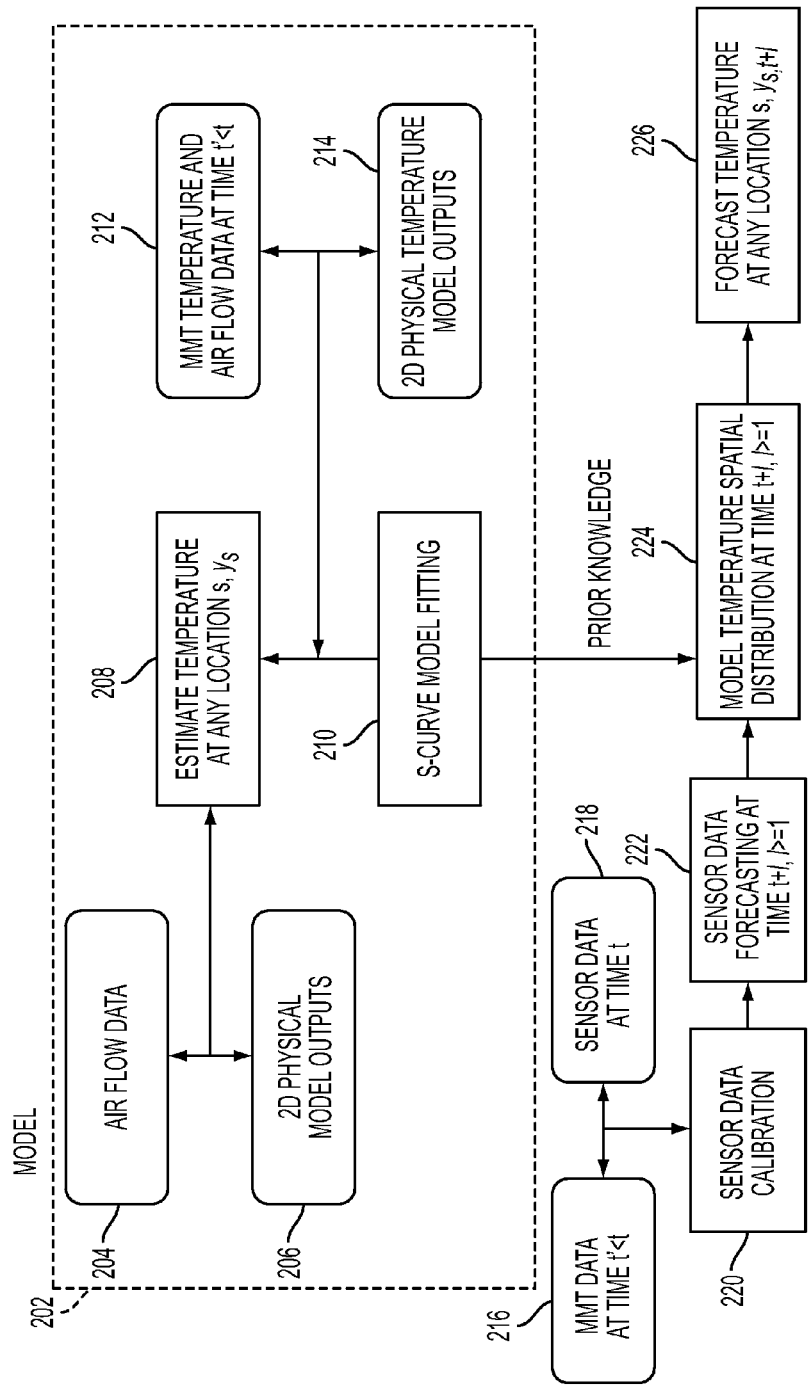
FIG. 2 is a diagram illustrating system analytics components in one embodiment of the present disclosure.

FIG. 2 is a diagram illustrating functional analytics components of a system in one embodiment of the present disclosure for 3-D temperature forecasting. A system for temperature forecasting in time and in space, in one embodiment, may include a sensor network, database and/or knowledge base, forecasting model module and a mechanism to share the forecasted results. As shown in FIG. 1, the sensor network is installed in the data center being considered to detect the current temperature of the data network in the specific areas where the sensors are located. The database and/or knowledge base is built in one embodiment of the present disclosure based on the temperature data from the sensors as well as the temperature data from an MMT. The components at 202 illustrate building of the database and/or knowledge base in one embodiment of the present disclosure.

The database and/or knowledge base (e.g., shown at 112 in FIG. 1) may be built using the following data sources to develop a temperature forecasting model: static temperature measurement experiment in high spatial resolution (e.g., MMT tool); and dynamic temperature sensor measurements in real time. In one aspect, the two data sources complement each other. One (MMT data) provides a thorough knowledge in space and the other one (sensor data) provides more information of temperature behavior over time. Those data sources may be combined to provide temperature forecasting at any location by minimizing the prediction error. Additional data sources may include power monitoring, asset data with nameplate power, data center (DC) layout, weather data, and/or business data.

Shown at 202, a knowledge base is developed using high-spatial-resolution temperature measurements 212 which are type cast temperature profiles as a function of physical observables (cooling conditions, air flow rate, equipment and ACU placements, ceiling heights) 204 and 206. For instance, a formulation 210 is derived for determining a temperature at any point in 3-dimensional space as a function of the physical observables, based on the high-spatial-resolution temperature data, for example, obtained via the MMT. In one embodiment, the high-spatial-resolution temperature data 212 (e.g., MMT data) is historic data (e.g., t'<t, where t is the current time and t' is the past time of which the high-spatial-resolution temperature data available). The formulation 210 in one embodiment may be a curve fitting model, for instance, which may perform S-curve model fitting based on the historic high-spatial-resolution temperature data.

A 2-dimensional physical temperature model 214 is built which includes temperature distribution estimation for two planes (x-y) in space (e.g., of the data center) based on the real-time sensor data collected from the sensor network. The two planes in one embodiment of the present disclosure are of the floor and ceiling of the space.

Based on the information (e.g., floor and ceiling temperatures) of the 2-dimensional physical temperature model 214, the formulation 210 can estimate the temperature at any location s, h, where s represents (x, y) plane coordinates in space and h represents the height (z coordinate) in 3-D space as shown at 208. The database so built thus may include 3-D temperature data of the space. A knowledge base is built using the 3-D MMT data and performed at same spatial resolution.

The knowledge base includes a formula with parameter coefficients determined from using the 3-D MMT data. In one embodiment, it is static not time varying. In one embodiment of the present disclosure, the knowledge base will be used to interpolate temperature in height since it is a function of height h.

The temperature database built at 202 is used in forecasting the temperature at a point in space (e.g., the data center) in future time. At 220, sensor data calibration is performed to calibrate the sensor measurements at time t 218 based on the historic high-spatial-resolution temperature data (e.g., MMT data) 216 (which in one embodiment is assumed as the true representation of temperature) and the sensor temperature measurements at the same historical time. The calibration at 220 is to calibrate sensor measurement due to sensor bias or external impact, for instance, because sensor measurements are considered as having measurement errors and MMT data are considered as true values of temperature. At 222, based on the sensor data calibration at 220, sensor data is forecasted, for instance, by applying a time series forecasting technique. This component provides temperature forecast at any future time t+l, given that current time is t and t>1. This component involves computation in time. It is performed at all sensor locations, e.g., it is performed at each individual sensor location.

At 224, temperature spatial distribution at future time may be modeled. The inputs to this component 224, in one embodiment include the forecasted sensor temperature values at time t+l (222). The knowledge base (202) is used to convert the 3-dimensional spatial interpolation to a 2-dimensional (2-D or 2-d) problem. Kriging method is used to perform the spatial interpolation in 2-D, i.e., predict temperature at any location given the inputs of forecasted sensor temperature values and projected values at time t+l (the projected values refer to those converted values using 3-d to 2-d techniques). The output of the component includes forecasted temperature at any location s and any future time t+l (226). Thus, as shown at 226, temperature at any location at any future time may be forecasted based on the model temperature spatial distribution.

Figure 3:
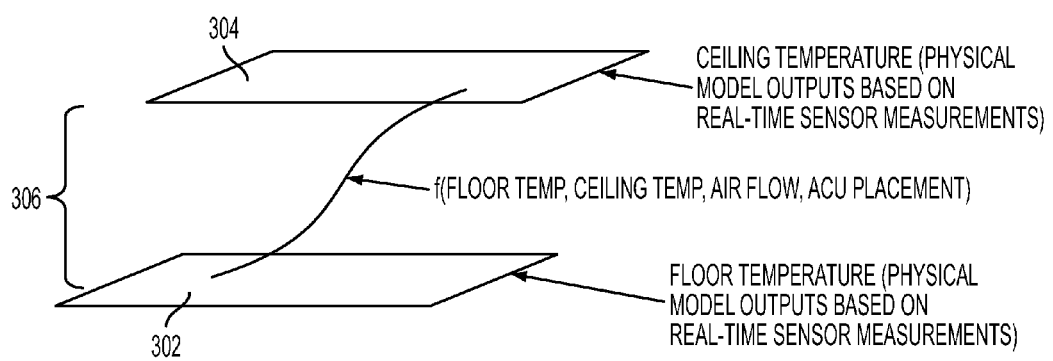
FIG. 3 is a diagram illustrating visually model fitting of a 3-dimensional temperature in one embodiment of the present disclosure.

FIG. 3 is a diagram illustrating visually model fitting of a 3-dimensional temperature in one embodiment of the present disclosure. Temperature profile may be generated as a function of physical observables (cooling conditions, air flow rate, equipment and air conditioning units, ceiling heights). The function for determining such temperature profile is derived in one embodiment of the present disclosure based on the high-spatial-resolution temperature data for example obtained from MMT. Eq. (1) is an example of such a function or model (also referred to in FIG. 2 at 210):

$$T(s, h) = 0.99A(s) + 0.91V(s) + \frac{1.09(B(s) - A(s))}{1 + \exp\{-0.43(h - 1.41 + 0.72V(s) - 0.66V(s)^2)\}} \quad (1)$$

A(s) represents temperature of the floor x-y coordinate point and B(s) represents the temperature of the ceiling's x-y coordinate point. V(s) represents the air velocity. The air velocity value at any location may be calculated through physical model using real-time air flow sensor measurements. s represents x-y coordinate and h represents height coordinate in 3-dimensional space.

The floor temperature for each of the x-y coordinate points is obtained based on the real-time sensor measurements. 302 in FIG. 3 shows the floor plane. Similarly, the ceiling temperature for each of the x-y coordinate points is obtained based on the real-time sensor measurements. 304 in FIG. 3 shows the ceiling plane. The two planes 302 and 304 and the associated temperature at the points on the planes are referred to in FIG. 2 as the 2-D physical temperature model outputs 214. Using Eq. (1) and the floor temperature data 302 and ceiling temperature data 304, temperature may be derived for any point in space 306 between the two planes 302, 304.

Figure 4A:
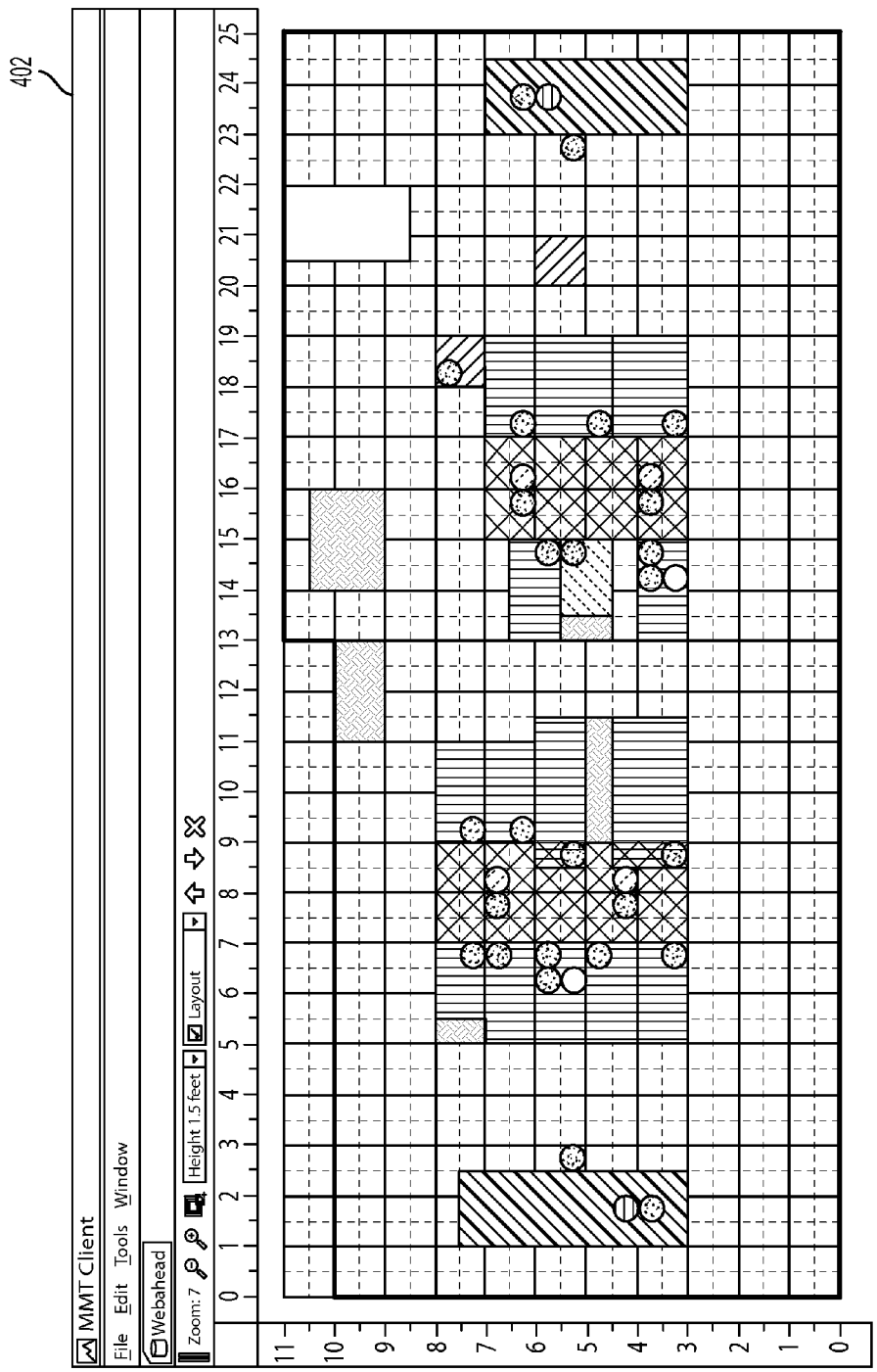
FIGS. 4A and 4B show sensor distribution in space, for instance, in a data center.
Figure 4B:
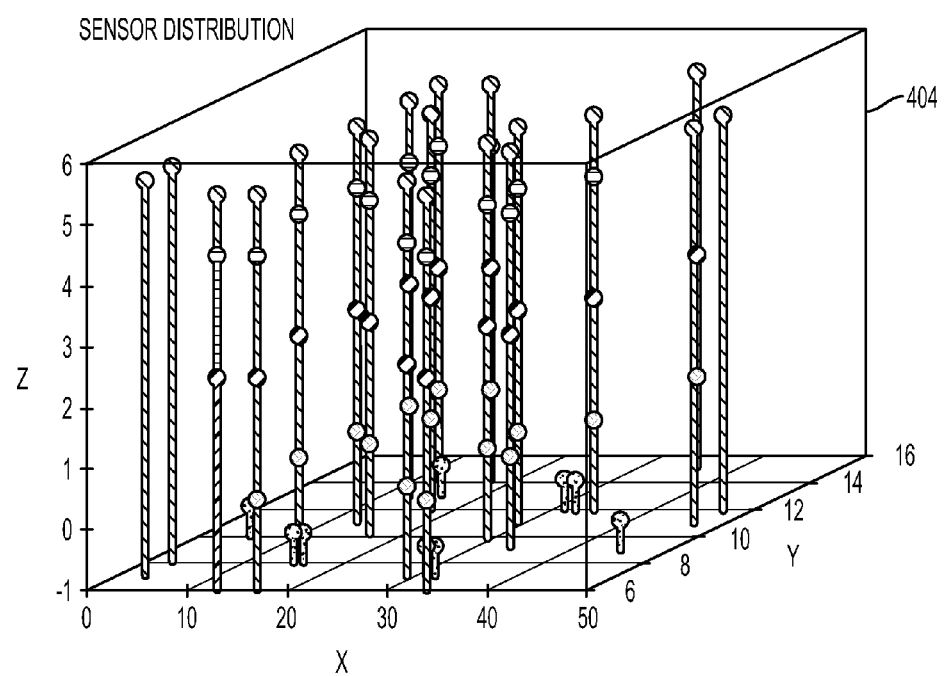

FIGS. 4A and 4B show sensor distribution in space, for instance, in a data center. 402 shows a 2-D top view of the space with a plurality of sensors (denoted by circles). The sensors may be installed on top or shelves of various equipments such as computer server racks in a data center. 404 shows a 3-D view of the space having the installed temperature sensors, also denoted by the circles. The sensors detect the temperature of the areas in real time. Based on this real time thermal sensor observations at sparsely located placed, temperature estimation may be calibrated based on knowledge base. Different shades of the sensors illustrate sensors installed at different heights, for example, heights from 1.5 feet to 5.5 feet. At sensor locations, temperature is forecasted at any future time t+l, assuming current time is t and l>=1 based on the historical temperature measurements and using a time series model. At time t+l, to predict the temperature at any location (s, z), the methodology of the present disclosure in one embodiment may first project all sensor temperatures observed at heights, z' to height z. Then apply 2-d kriging method to interpolate all temperature values at height z and thus provide prediction of temperature at (s, z).

Figure 5:
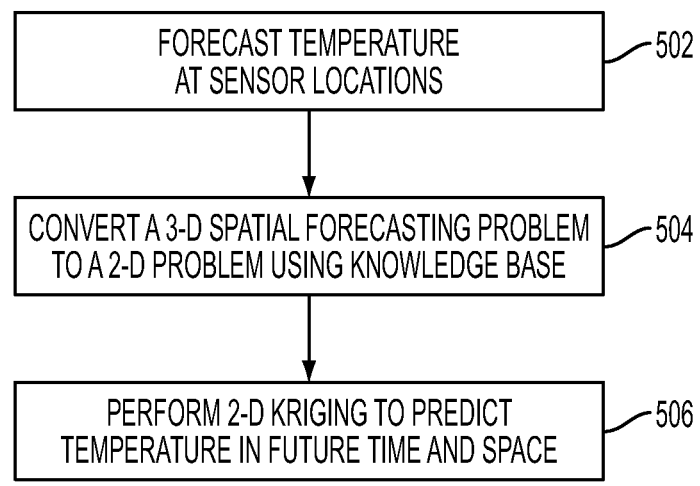
FIG. 5 illustrates a method of 3-D real-time temperature forecasting in one embodiment of the present disclosure.

FIG. 5 illustrates a method of 3-D real-time temperature forecasting in one embodiment of the present disclosure. A problem to be solved in one aspect may be characterized as: given sensor observations till time t, $$y(s_i, h_l, t), i=1, \ldots, N, l=1, \ldots, L, t=1, \ldots, T$$

forecast temperature at any location, any height k, and future time $$y(s_0, h_k, t+l)$$

where l>=1.

At 502, temperature at sensor locations are forecasted, e.g., by computing $$y(s_i, h_l, t+l) = f(y(s_i, h_l, t), X) + \epsilon_{t+l}, \epsilon_{t+l} \sim N(0, \sigma^2)$$

The error term captures the variation of the temporal prediction model. It is assumed that the error is normally distributed with mean 0 and variance equal to $\sigma^2$.

Temporal correlation, such as first order autocorrelation, daily and weekly cycles are included in one embodiment of the present disclosure. If external factors, such as power data and weather data, are available, they can be incorporated to help forecasting in this step. X represents the external factors as mentioned above. The above time series forecasting model, for example, may be written as:

$$y^*(s_i, h_l, t+1) - \phi y^*(s_i, h_l, t+1-b) = \rho(y^*(s_i, h_l, t) - \phi y^*(s_i, h_l, t-b)) + \epsilon_{i+1} + \theta \epsilon_i, \epsilon_{i+1} \sim N(0, \sigma^2) \quad (1.1)$$

where $y^*(s_i, h_l, t) = y(s_i, h_l, t) - X\beta$ is the residual after removing external factor impact, b refers to the seasonal cycle, such as daily or weekly cycle, $\phi$ captures the temporal correlation for seasonal term, $\rho$ captures the first-order temporal correlation and $\theta$ considers the correlation of moving average term. Such time series model is performed at each sensor location and only uses the temperature measurements collected by this sensor in one embodiment of the present disclosure.

At 504, the methodology of the present disclosure in one embodiment converts a 3-D spatial forecasting problem to a 2-D problem using knowledge base. For example, temperature data at two different heights are forecasted. To forecast temperature at a location at height $h_k$, the problem can be summarized as $$y(s_i, h_l, t+l) \Rightarrow \tilde{y}(s_i, h_k, t+l) \quad (2)$$

$$\text{var}(\tilde{y}(s_i, h_k, t+l)) = \tau^2 + \sigma^2 \quad (3)$$

Given the 2-D physical model outputs, A(s), B(s) and V(s), which are calculated using forecasted sensor temperatures at time t+l, the temperatures at any locations at time t+l can be determined using Equation (1), for example, $T(s_i, h_m, t+l)$ and $T(s_i, h_k, t+l)$, m≠. Assume we have forecasted temperature, $y(s_i, h_m, t+l)$, at sensor location $(s_i, h_m)$, using sensor observation $y(s_i, h_m, t)$, then the temperature at different height $h_k$ equals $\tilde{y}(s_i, h_k, t+l) = y(s_i, h_m, t+l) - T(s_i, h_m, t+l) + T(s_i, h_k, t+l)$. Using this, the method of the present disclosure in one embodiment may project the temperature at height $h_m$ to the temperature at height $h_k$. The variance of this projection estimation equals the variance of S-curve estimation plus the variance of time series forecasting. This is shown at 224 in FIG. 2 and 506 in FIG. 5.

$\tau^2 + \sigma^2$ represents uncertainties, e.g., due to 3-D to 2-D conversion and temporal uncertainty, respectively.

At 506, given the forecasted and projected sensor temperatures at height $h_k$ and time t+l, to forecast the temperature at any location $s_0$ of the same height $h_k$ at time t+l, 2-D kriging may be performed:

$$y(s_0, h_k, t+l) = \quad (4)$$

$$\sum_{i=1}^{N} \lambda_i y(s_i, h_k, t+l) = \sum_{i \in \Omega_k} \theta_i y(s_i, h_k, t+l) + \sum_{i \notin \Omega_k} \delta_i \tilde{y}(s_i, h_k, t+l)$$

$$\text{s.t.} \sum_{i=1}^{N} \lambda_i = 1$$

where $\Omega_k$ is the collection of the sensors which are installed at height $h_k$. $y(s_i, h_k, t+l)$ is the forecasted temperature value at sensor location $(s_i, h_k)$ based on the history of sensor measurements, $y(s_i, h_k, t)$. $\tilde{y}(s_i, h_k, t+l)$ is the projected temperature value using 3D-to-2D conversion method based on temperatures collected from sensors installed at $h_m$ and m≠k.

Different from traditional 2-D kriging, the present disclosure may treat the observations as having measurement errors. In one aspect, the goal is to minimize $$E\left(y(s_0, h_k, t+1) - \sum_{i=1}^{N} \lambda_i y(s_i, h_k, t+l)\right)^2 \quad (5)$$

which is equivalent to minimizing $$C(0) - \sum_i \sum_j \lambda_i \lambda_j C(s_i - s_j) - 2\sum_j \lambda_i C(s_0 - s_j) - 2m\left(\sum_i \lambda_i - 1\right) \quad (6)$$

where $$\text{cov}(y(s_i, h_k), y(s_j, h_k)) = \begin{cases} \omega^2 + \sigma^2 + \tau^2 & i = j \\ \omega^2 \rho(d_{ij}) & i \neq j \end{cases} \quad (7)$$

-continued $$\operatorname{cov}(\tilde{y}(s_i, h_k), \tilde{y}(s_j, h_k)) = \operatorname{cov}(y(s_i, h_k), \tilde{y}(s_j, h_k)) = \begin{cases} \omega^2 & i = j \\ \omega^2 \rho(d_{ij}) & i \neq j \end{cases} \quad (8)$$

Once (7) and (8) are calculated, $\lambda_i$s are the parameters to be estimated by minimizing (6). After obtaining the estimates of $\lambda_i$ and plugging them back in (4), then the temperature, $y(s_0, h_k, t+l)$, at a new location for a future time can be predicted.

2-D kriging performs interpolation which predicts unknown values from data observed at known locations (See, Cressie, N. (1993). Statistics for Spatial Data, Revised Edition. New York, N.Y.: Wiley). For instance, assume we have observations, $y(s_i)$ at location $s_i, i=1, \ldots, N$ We omit the notations for height and time, since the 2-D kriging is performed on one plane of same height and at same time point. Then the kriging estimator of the temperature at any unobserved location $s_0$, $y(s_0)$ is a linear combination of all observations, i.e., $$y(s_0) = \sum_{i=1}^{N} \lambda_i y(s_i),$$

where $\lambda_i, i=1, \ldots, N$ is the weight parameter and determined by minimizing the prediction error $$E\left(y(s_0) - \sum_{i=1}^{N} \lambda_i y(s_i)\right)^2.$$

Once $\lambda_i, i=1, \ldots, N$ are estimated, $y(s_0)$ can be calculated.

In one embodiment of the present disclosure, as explained above, a statistical time series model is developed to forecast temperature at time t+l, where l>=1, using real-time sensor measurements at time t. The temporal model can also incorporate external information, such as power information and weather data.

In the present disclosure, temperature forecasting may be provided in a dynamic way and forecast time interval may be adjusted by users' request. Thus, a system and method of data center thermal management in one embodiment of the present disclosure may provide temperature forecast in future time and in space dynamically.

As described above, two data sources, the static temperature measurement experiment in high spatial resolution and dynamic temperature sensor measurements in real time may be utilized for forecasting. External data sources, such as power data, weather data and business data can be also incorporated in the model. A knowledge base is developed using the first data source, the static temperature measurement experiment in high spatial resolution. The knowledge base is type cast temperature profiles as a function of physical observables (cooling conditions, air flow rate, equipment and ACU placements, ceiling heights). The knowledge base in one embodiment includes a formulation of temperature profile functions including parameters and sets of physical observables as inputs. The physical observables may depend on the inputs of real-time sensor measurements and in forecast mode, the inputs are provided as forecasted temperature at sensor locations using time series forecasting model in one embodiment of the present disclosure.

The knowledge base in one embodiment includes the spatial correlation modeling developed based on the high-resolution temperature measurements and may be used for 2-D spatial forecast in kriging step.

A statistical time series model is developed in one embodiment based on the real-time sensor measurements to provide temperature forecast in future time. This model predicts or forecasts temperature associated with the sensors in future point in time. The temperature may be forecasted for the sensor location level. External covariate information, such as power data and weather data can be incorporated in the temperature forecasting. For example, such covariate information may be included as X in Equation (1.1) above. In addition, the temporal correlation may be considered by different time lags and different time cycles, such as weekly and daily pattern. That is, temperature data may be predicted for different periodical times, for example, hourly, weekly and/or daily.

Then the spatial forecasting in three-dimensions of temperature may be modeled. As described above, sensor data prediction at 502 in FIG. 5 performed forecasting in time. After 3-D to 2-D conversion at 504, kriging is used for forecasting in space, e.g., predicting temperature at unobserved locations. In one embodiment of the present disclosure, spatial forecasting in 3-D is given by the two-step procedure: first, 3-D to 2-D conversion as described in Equations (2) and (3), then 2-D kriging as described in Equation (5). A prior knowledge of temperature trend in vertical dimension is learned using the knowledge base. For instance, the knowledge base can be summarized using Equation (1) where the height h is one of the inputs. The temperature trend in vertical dimension can be learned in Equation (1). The three-dimensional spatial forecasting is converted to a two-dimensional problem and 2-d kriging is used for spatial interpolation. The prior knowledge of spatial correlation can be learned from the knowledge base.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages, a scripting language such as Perl, VBS or similar languages, and/or functional languages such as Lisp and ML and logic-oriented languages such as Prolog. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The systems and methodologies of the present disclosure may be carried out or executed in a computer system that includes a processing unit, which houses one or more processors and/or cores, memory and other systems components (not shown expressly in the drawing) that implement a computer processing system, or computer that may execute a computer program product. The computer program product may comprise media, for example a hard disk, a compact storage medium such as a compact disc, or other storage devices, which may be read by the processing unit by any techniques known or will be known to the skilled artisan for providing the computer program product to the processing system for execution.

The computer program product may comprise all the respective features enabling the implementation of the methodology described herein, and which—when loaded in a computer system—is able to carry out the methods. Computer program, software program, program, or software, in the present context means any expression, in any language, code or notation, of a set of instructions intended to cause a system having an information processing capability to perform a particular function either directly or after either or both of the following: (a) conversion to another language, code or notation; and/or (b) reproduction in a different material form.

The computer processing system that carries out the system and method of the present disclosure may also include a display device such as a monitor or display screen for presenting output displays and providing a display through which the user may input data and interact with the processing system, for instance, in cooperation with input devices such as the keyboard and mouse device or pointing device. The computer processing system may be also connected or coupled to one or more peripheral devices such as the printer, scanner, speaker, and any other devices, directly or via remote connections. The computer processing system may be connected or coupled to one or more other processing systems such as a server, other remote computer processing system, network storage devices, via any one or more of a local Ethernet, WAN connection, Internet, etc. or via any other networking methodologies that connect different computing systems and allow them to communicate with one another. The various functionalities and modules of the systems and methods of the present disclosure may be implemented or carried out distributedly on different processing systems or on any single platform, for instance, accessing data stored locally or distributedly on the network.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Various aspects of the present disclosure may be embodied as a program, software, or computer instructions embodied in a computer or machine usable or readable medium, which causes the computer or machine to perform the steps of the method when executed on the computer, processor, and/or machine. A program storage device readable by a machine, tangibly embodying a program of instructions executable by the machine to perform various functionalities and methods described in the present disclosure is also provided.

The system and method of the present disclosure may be implemented and run on a general-purpose computer or special-purpose computer system. The computer system may be any type of known or will be known systems and may typically include a processor, memory device, a storage device, input/output devices, internal buses, and/or a communications interface for communicating with other computer systems in conjunction with communication hardware and software, etc.

The terms "computer system" and "computer network" as may be used in the present application may include a variety of combinations of fixed and/or portable computer hardware, software, peripherals, and storage devices. The computer system may include a plurality of individual components that are networked or otherwise linked to perform collaboratively, or may include one or more stand-alone components. The hardware and software components of the computer system of the present application may include and may be included within fixed and portable devices such as desktop, laptop, and/or server. A module may be a component of a device, software, program, or system that implements some "functionality", which can be embodied as software, hardware, firmware, electronic circuitry, or etc.

The embodiments described above are illustrative examples and it should not be construed that the present invention is limited to these particular embodiments. Thus, various changes and modifications may be effected by one skilled in the art without departing from the spirit or scope of the invention as defined in the appended claims.

We claim:

1. A method of data center thermal management, comprising:

receiving, by a processor, historical high-spatial-resolution temperature data;

deriving, by the processor, a first formulation based on the historical high-spatial-resolution temperature data for determining a temperature at any point in 3-dimensional space as a function of physical observables;

receiving, by the processor, dynamic temperature sensor measurement data in real-time measured by a plurality of sensors at respective plurality of sensor locations;

calibrating, by the processor, the dynamic temperature sensor measurement data based on a calibration model using the historical high-spatial-resolution temperature data and sensor temperatures at a corresponding historical time and location;

forecasting, by the processor, sensor temperature data at said plurality of sensor locations for a future time based on the calibrated dynamic temperature sensor measurement data;

generating, by the processor, a three-dimensional temperature spatial distribution associated with the future time based on the forecasted sensor temperature data and the first formulation;

projecting, by the processor, the three-dimensional temperature spatial distribution associated with the future time to a two-dimensional temperature distribution, wherein the projecting comprises determining temperature in the future time of a location having x and y-coordinates of a sensor location and z-coordinate corresponding to a height dimension of a selected space location, for the plurality of sensor locations respectively; and forecasting, by the processor, temperature in the future time for the selected space location dynamically based on said two-dimensional temperature distribution, wherein the processor is coupled to a network of sensors comprising the plurality of sensors, and a client device controls data center temperature based on the forecast temperature in the future time, wherein the forecasting sensor temperature data comprises generating a time series forecasting model to predict said sensor temperature data at said plurality of sensor locations for the future time, wherein the time series forecasting model is generated at a respective location of said plurality of sensor locations using only temperature measurements collected by a sensor at the respective sensor location, wherein the time series forecasting model comprises:

$$y^*(s_i,h_l,t+1) - \phi y^*(s_i,h_l,t+1-b) = \rho(y^*(s_i,h_l,t) - \phi y^*(s_i,h_l,t-b)) + \epsilon_{t+1} + \theta \epsilon_t,$$

wherein $y^*(s_i,h_l,t) = y(s_i,h_l,t) - X\beta$ is a residual after removing external factor impact, b refers to seasonal cycle, $\phi$ captures temporal correlation for seasonal term which indicates a dependence of temperature at time t on temperature at time t−b, $\rho$ captures first-order temporal correlation which indicates a dependence of the temperature at time t on temperature at previous time t−1, and $\theta$ considers a correlation of moving average term which indicates a temporal dependence among random error terms, $y^*$ represents predicted temperature, $s_i$ represents location at x-y coordinate, $h_l$ represents height, t represents time, $\epsilon_{t+1}$ and $\epsilon_t$ represent error terms.

2. The method of claim 1, wherein the forecasting temperature in the future time for a selected space location dynamically comprises performing 2-d kriging spatial interpolation of said two-dimensional temperature distribution.

3. The method of claim 2, wherein the performing 2-d kriging spatial interpolation comprises:

$$y(s_0, h_k, t+l) =$$

$$\sum_{i=1}^{N} \lambda_i y(s_i, h_k, t+l) = \sum_{i \in \Omega_k} \theta_i y(s_i, h_k, t+l) + \sum_{i \notin \Omega_k} \delta_i \tilde{y}(s_i, h_k, t+l)$$

$$\text{s.t.} \sum_{i=1}^{N} \lambda_i = 1$$

wherein $\Omega_k$ is a collection of sensors which are installed at height $h_k$, $y(s_i,h_k,t+l)$ is forecasted temperature value at sensor location $(s_i,h_k)$ based on the history of sensor measurements, $y(s_i,h_k,t)$, $\tilde{y}(s_i,h_k,t+l)$ is projected temperature value using 3D-to-2D conversion based on temperatures collected from sensors installed at $h_m$ and $m \neq k$, wherein the temperature, $y(s_0,h_k,t+l)$, at an unobserved location, $s_0$, is a linear combination of all forecasted temperatures and projected temperatures for same future time t+l at same height, $h_k$, wherein $\lambda_i$, $\theta_i$, $\delta_i$ represent correlation parameters.

4. The method of claim 1, wherein the first formulation is a curve fitting model.

5. The method of claim 4, wherein the first formulation comprises:

$$T(s, h) =$$

$$0.99A(s) + 0.91V(s) + \frac{1.09(B(s) - A(s))}{1 + \exp\{-0.43(h - 1.41 + 0.72V(s) - 0.66V(s)^2)\}},$$

wherein A(s) represents temperature of a floor x-y coordinate point, B(s) represents temperature of a ceiling's x-y coordinate point, and V(s) represents air velocity computed based on real-time air flow sensor measurements, s represents x-y coordinate and h represents height coordinate.

6. The method of claim 1, wherein the historical high-spatial-resolution temperature data comprises MMT data taken in sparse periods of time.

7. The method of claim 1, wherein the dynamic temperature sensor measurement data in real-time is measured by a plurality of sensors sparsely located at respective plurality of sensor locations.

8. A non-transitory computer readable storage medium storing a program of instructions executable by a machine to perform a method of data center thermal management, comprising: receiving historical high-spatial-resolution temperature data; deriving a first formulation based on the historical high-spatial-resolution temperature data for determining a temperature at any point in 3-dimensional space as a function of physical observables; receiving dynamic temperature sensor measurement data in real-time measured by a plurality of sensors at respective plurality of sensor locations; calibrating the dynamic temperature sensor measurement data based on a calibration model using the historical high-spatial-resolution temperature data and sensor temperatures at a corresponding historical time and location; forecasting sensor temperature data at said plurality of sensor locations for a future time based on the calibrated dynamic temperature sensor measurement data; generating a three-dimensional temperature spatial distribution, n associated with the future time based on the forecasted sensor temperature data and the first formulation; projecting the three-dimensional temperature spatial distribution associated with the future time to a two-dimensional temperature distribution, wherein the projecting comprises determining temperature in the future time of a location having x and y-coordinates of a sensor location and z-coordinate corresponding to a height dimension of a selected space location, for the plurality of sensor locations respectively; and forecasting temperature in the future time for the selected space location dynamically based on said two-dimensional temperature distribution, wherein the processor is coupled to a network of sensors comprising the plurality of sensors, and a client device controls data center temperature based on the forecast temperature in the future time, wherein the forecasting sensor temperature data comprises generating a time series forecasting model to predict said sensor temperature data at said plurality of sensor locations for the future time, wherein the time series forecasting model comprises:

$$y^*(s_i,h_i,t+1) - \phi y^*(s_i,h_i,t+1-b) = \rho(y^*(s_i,h_i,t) - \phi y^*(s_i,h_i,t-b)) + \epsilon_{t+1} + \theta \epsilon_t,$$

wherein $y^*(s_i,h_i,t) = y(s_i,h_i,t) - X\beta$ is a residual after removing external factor impact, b refers to seasonal cycle, $\phi$ captures temporal correlation for seasonal term which indicates a dependence of temperature at time t on temperature at time t−b, $\rho$ captures first-order temporal correlation which indicates a dependence of the temperature at time t on temperature at previous time t−1, and $\theta$ considers a correlation of moving average term which indicates a temporal dependence among random error terms, y* represents predicted temperature, $s_i$ represents location at x-y coordinate $h_i$ represents height, t represents time, $\epsilon_{t+1}$ and $\epsilon_t$ represent error terms.

9. The non-transitory computer readable storage medium of claim 8, wherein the forecasting temperature in the future time for a selected space location dynamically comprises performing 2-d kriging spatial interpolation of said two-dimensional temperature distribution.

10. The non-transitory computer readable storage medium of claim 9, wherein the performing 2-d kriging spatial interpolation comprises:

$$y(s_0, h_k, t+l) =$$

$$\sum_{i=1}^{N} \lambda_i y(s_i, h_k, t+l) = \sum_{i \in \Omega_k} \theta_i y(s_i, h_k, t+l) + \sum_{i \notin \Omega_k} \delta_i \tilde{y}(s_i, h_k, t+l)$$

$$\text{s.t.} \sum_{i=1}^{N} \lambda_i = 1$$

wherein $\Omega_k$ is a collection of sensors which are installed at height $h_k$, $y(s_i,h_k,t+l)$ is forecasted temperature value at sensor location $(s_i,h_k)$ based on the history of sensor measurements, $y(s_i,h_k,t)$, $\tilde{y}(s_i,h_k,t+l)$ is projected temperature value using 3D-to-2D conversion based on temperatures collected from sensors installed at $h_m$ and $m \neq k$, wherein the temperature, $y(s_O,h_k,t+1)$, at an unobserved location, $s_O$, is a linear combination of all forecasted temperatures and projected temperatures for same future time t+1 at same height, $h_k$.

11. The non-transitory computer readable storage medium of claim 8, wherein the first formulation is a curve fitting model.

12. The non-transitory computer readable storage medium of claim 11, wherein the first formulation comprises:

$$T(s, h) = 0.99A(s) + 0.91V(s) + \frac{1.09(B(s) - A(s))}{1 + \exp\{-0.43(h - 1.41 + 0.72V(s) - 0.66V(s)^2)\}},$$

wherein A(s) represents temperature of a floor x-y coordinate point, B(s) represents temperature of a ceiling's x-y coordinate point, and V(s) represents air velocity computed based on real-time air flow sensor measurements, s represents x-y coordinate and h represents height coordinate.

13. The non-transitory computer readable storage medium of claim 8, wherein the historical high-spatial-resolution temperature data comprises MMT data taken in sparse periods of time.

14. The non-transitory computer readable storage medium of claim 8, wherein the dynamic temperature sensor measurement data in real-time is measured by a plurality of sensors sparsely located at respective plurality of sensor locations.

15. A system for data center thermal management, comprising: a knowledge-base comprising a first formulation built based on historical high-spatial-resolution temperature data, the first formulation for determining a temperature at any point in 3-dimensional space as a function of physical observables; a calibration module for calibrating dynamic temperature sensor measurement data measured by a plurality of sensors at respective plurality of sensor locations, the calibrating performed based on a calibration model using the historical high-spatial-resolution temperature data and sensor temperatures at a corresponding historical time and location; a first forecast module for forecasting sensor temperature data at said plurality of sensor locations for a future time based on the calibrated dynamic temperature sensor measurement data; a second forecast module for generating a three-dimensional temperature spatial distribution associated with the future time based on the forecasted sensor temperature data and the first formulation, the second forecast module further projecting the three-dimensional temperature spatial distribution associated with the future time to a two-dimensional temperature distribution, wherein the projecting comprises determining temperature in the future time of a location having x and y-coordinates of a sensor location and z-coordinate corresponding to a height dimension of a selected space location, for the plurality of sensor locations respectively, the second forecast module further for forecasting temperature in the future time for the selected space location dynamically based on said two-dimensional temperature distribution; a network of sensors comprising the plurality of sensors; a server comprising the knowledge-base, the calibration module, the first forecast module and the second forecast module; and a client device that controls data center temperature based on the forecast temperature in the future time, wherein the forecasting sensor temperature data comprises generating a time series forecasting model to predict said sensor temperature data at said plurality of sensor locations for the future time, wherein the time series forecasting model comprises:

$$y^*(s_i,h_l,t+1) - \phi y^*(s_i,h_l,t+1-b) = \rho(y^*(s_i,h_l,t) - \phi y^*(s_i,h_l,t-b)) + \epsilon_{t+1} + \theta \epsilon_t,$$

wherein $y^*(s_i,h_l,t) = y(s_i,h_l,t) - X\beta$ is a residual after removing external factor impact, b refers to seasonal cycle, $\phi$ captures temporal correlation for seasonal term which indicates a dependence of temperature at time t on temperature at time t−b, $\rho$ captures first-order temporal correlation which indicates a dependence of the temperature at time t on temperature at previous time t−1, and $\theta$ considers a correlation of moving average term which indicates a temporal dependence among random error terms, y* represents predicted temperature,
$s_i$ represents location at x-y coordinate
$h_l$ represents height,
t represents time,
$\epsilon_{t+1}$ and $\epsilon_t$ represent error terms.

16. The system of claim 15, wherein the first forecast module forecasts the sensor temperature data based on a time series forecasting model to predict said sensor temperature data at said plurality of sensor locations for the future time.

17. The system of claim 15, wherein the second forecast module forecasts the temperature in the future time for the selected space location dynamically based on performing a 2-d kriging spatial interpolation of said two-dimensional temperature distribution.

18. The system of claim 15, wherein the first formulation is a curve fitting model.

* * * * *